(12) United States Patent
Banerjee et al.

(10) Patent No.: US 10,680,094 B2
(45) Date of Patent: Jun. 9, 2020

(54) ELECTRONIC DEVICE INCLUDING A HIGH ELECTRON MOBILITY TRANSISTOR INCLUDING A GATE ELECTRODE

(71) Applicant: SEMICONDUCTOR COMPONENTS INDUSTRIES, LLC, Phoenix, AZ (US)

(72) Inventors: Abhishek Banerjee, Kruibeke (BE); Piet Vanmeerbeek, Sleidinge (BE); Peter Moens, Erwetegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 9 days.

(21) Appl. No.: 16/052,041

(22) Filed: Aug. 1, 2018

(65) Prior Publication Data

US 2020/0044067 A1    Feb. 6, 2020

(51) Int. Cl.
*H01L 29/15* (2006.01)
*H01L 31/0256* (2006.01)
(Continued)

(52) U.S. Cl.
CPC ...... *H01L 29/7787* (2013.01); *H01L 21/0217* (2013.01); *H01L 21/0254* (2013.01);
(Continued)

(58) Field of Classification Search
CPC .............. H01L 29/7787; H01L 29/205; H01L 21/0254; H01L 29/517; H01L 29/4236;
(Continued)

(56) References Cited

U.S. PATENT DOCUMENTS 5,804,839 A    9/1998 Hanaoka et al.
9,728,629 B1   8/2017 Banerjee et al.
(Continued)

OTHER PUBLICATIONS

Marcon et al.;"Direct Comparison of GaN-based E-mode Architectures (Recessed MISHEMT and p-GaN HEMTs) Processed on 200mm GaN-on-Si with Au-free Technology"; Proc. of SPIE; vol. 9363; pp. 936311-1 to 936311-12.
(Continued)

*Primary Examiner* — Ismail A Muse
(74) *Attorney, Agent, or Firm* — Abel Schillinger, LLP

(57) ABSTRACT

An electronic device can include a channel layer including $Al_zGa_{(1-z)}N$, where $0 \leq z \leq 0.1$; a gate dielectric layer; and a gate electrode of a high electron mobility transistor (HEMT). The gate dielectric layer can be disposed between the channel layer and the gate electrode. The gate electrode includes a gate electrode film that contacts the gate dielectric layer, wherein the gate electrode film can include a material, wherein the material has a sum of an electron affinity and a bandgap energy of at least 6 eV. In some embodiments, the material can include a p-type semiconductor material. The particular material for the gate electrode film can be selected to achieve a desired threshold voltage for an enhancement-mode HEMT. In another embodiment, a portion of the barrier layer can be left intact under the gate structure. Such a configuration can improve carrier mobility and reduce Rdson.

16 Claims, 5 Drawing Sheets

(51) Int. Cl.

| | |
|---|---|
| *H01L 29/778* | (2006.01) |
| *H01L 29/205* | (2006.01) |
| *H01L 29/51* | (2006.01) |
| *H01L 29/49* | (2006.01) |
| *H01L 29/423* | (2006.01) |
| *H01L 29/66* | (2006.01) |
| *H01L 21/02* | (2006.01) |
| *H01L 29/36* | (2006.01) |
| *H01L 29/10* | (2006.01) |
| *H01L 21/306* | (2006.01) |
| *H01L 21/28* | (2006.01) |
| *H01L 29/20* | (2006.01) |
| *H01L 23/31* | (2006.01) |
| *H01L 23/29* | (2006.01) |

(52) U.S. Cl.
CPC .... *H01L 21/0262* (2013.01); *H01L 21/02181* (2013.01); *H01L 21/02208* (2013.01); *H01L 21/02271* (2013.01); *H01L 21/28264* (2013.01); *H01L 21/30612* (2013.01); *H01L 21/30621* (2013.01); *H01L 29/1033* (2013.01); *H01L 29/2003* (2013.01); *H01L 29/205* (2013.01); *H01L 29/36* (2013.01); *H01L 29/4236* (2013.01); *H01L 29/4966* (2013.01); *H01L 29/513* (2013.01); *H01L 29/517* (2013.01); *H01L 29/66462* (2013.01); *H01L 23/291* (2013.01); *H01L 23/3171* (2013.01)

(58) Field of Classification Search
CPC .......... H01L 29/1033; H01L 21/02271; H01L 21/30621; H01L 29/2003; H01L 29/4966; H01L 21/0262; H01L 29/36; H01L 29/66462; H01L 21/0217; H01L 21/02208; H01L 21/02181; H01L 21/30612; H01L 21/28264; H01L 29/513; H01L 23/3171; H01L 23/291

See application file for complete search history.

(56) References Cited

U.S. PATENT DOCUMENTS

| | | | |
|---|---|---|---|
| 2006/0199338 A1* | 9/2006 | Eldridge | H01L 27/115 438/266 |
| 2008/0210988 A1* | 9/2008 | Twynam | H01L 29/42316 257/260 |
| 2009/0194790 A1* | 8/2009 | Sato | H01L 29/7789 257/192 |
| 2009/0200575 A1* | 8/2009 | Shimoida | H01L 29/267 257/192 |
| 2012/0086049 A1* | 4/2012 | Hwang | H01L 29/66462 257/194 |
| 2014/0264365 A1* | 9/2014 | Wong | H01L 29/66462 257/76 |
| 2015/0115323 A1* | 4/2015 | Kawai | H01L 29/66431 257/192 |
| 2018/0151681 A1* | 5/2018 | Lavanga | H01L 21/30621 |
| 2018/0166565 A1* | 6/2018 | Chen | H01L 29/1066 |
| 2018/0308950 A1* | 10/2018 | Shimizu | H01L 29/402 |
| 2018/0323297 A1* | 11/2018 | Suh | H01L 29/66462 |

OTHER PUBLICATIONS

He et al.; "Performance and VTH Stability in E-Mode GaNFully MIS-FETs and Partially Recessed MIS-HEMTs with LPCVD-SiNx/PECVD-SiNx Gate Dielectric Stack"; IEEE Transactions on Electron Device; 2018; pp. 1-7.

Dabiran et al.; "Direct Deposition of GaN-based Photocathodes on Microchannel Plates"; Proc. of SPIE' vol. 7212; 2009; pp. 721213-1 to 721213-7.

Li et al.; Threshold Votage Control in Al0.72Ga0.28N/AlN/GaN HEMTs by Work-Function Engineering; IEEE Electron Device Letters; vol. 31, No. 9; 2010; pp. 954-956.

Hong et al.; Low-Resistance Ohmic Contacts for High-Power GaN Fiedl-Effect Transistors Obtained by Selective Area Growth Using Plasma-Assisted Molecular Beam Epitaxy; Applied Physics Letters; vol. 89; 2006; pp. 042101-1 to 042101-3.

U.S. Appl. No. 15/977,051, filed May 11, 2018; Roig-Guitart et al., Specification pp. 1-20, Drawing sheets 1-8.

U.S. Appl. No. 15/997,122, filed Jun. 4, 2018; Banerjee et al., Specification pp. 1-21, Drawing sheets 1-4.

* cited by examiner

ELECTRONIC DEVICE INCLUDING A HIGH ELECTRON MOBILITY TRANSISTOR INCLUDING A GATE ELECTRODE

FIELD OF THE DISCLOSURE

The present disclosure relates to electronic devices, and more particularly to, electronic devices including high electron mobility transistors including gate dielectric layers and gate electrodes.

RELATED ART

High electron mobility transistors can be enhancement-mode transistors. In some enhancement-mode high electron mobility transistors, a p-type GaN layer is used as a gate electrode and contacts the channel layer. Such a configuration can help to improve the pinch-off voltage; however, carrier mobility under the gate electrode is reduced and results in higher on-state resistance between the source and drain electrodes. Some designs, such as multi-finger configurations, may have relatively higher pinch-off voltages to ensure all fingers are turned off. Further improvement of enhancement-mode high electron mobility transistors without the previously mentioned adverse complications is desired.

BRIEF DESCRIPTION OF THE DRAWINGS

Embodiments are illustrated by way of example and are not limited in the accompanying figures.

Figure 1:
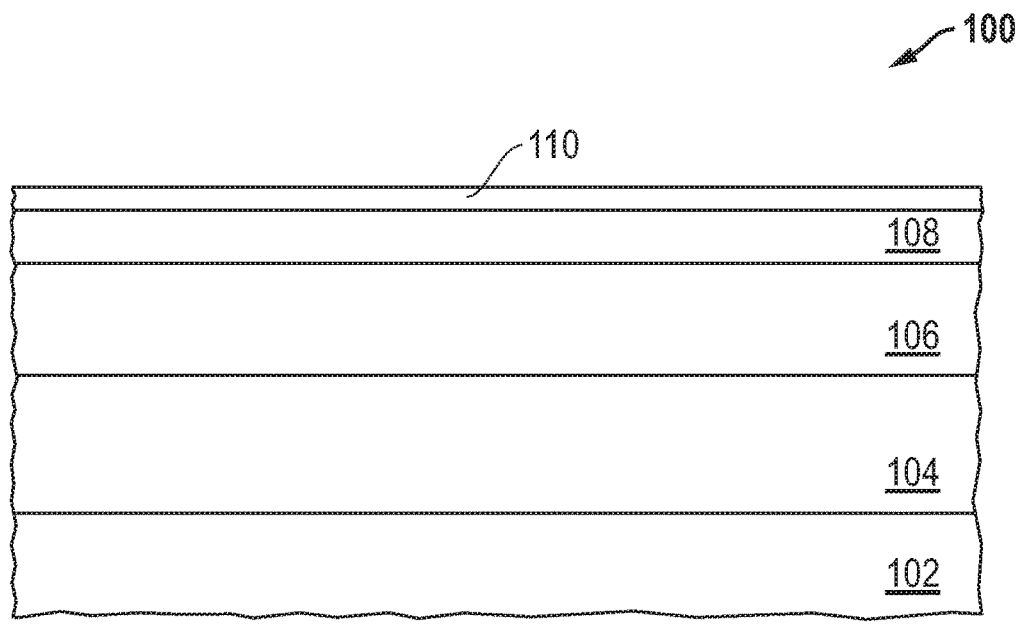
FIG. 1 includes an illustration of a cross-sectional view of a portion of a workpiece including a substrate, a buffer layer, a channel layer, a buffer layer, and a passivation layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a channel layer including $Al_zGa_{(1-z)}N$, where $0 \leq z \leq 0.1$; a gate dielectric layer; and a gate electrode of a high electron mobility transistor (HEMT). The gate dielectric layer can be disposed between the channel layer and the gate electrode. The gate electrode includes a first gate electrode film that contacts the gate dielectric layer, wherein the first gate electrode film can include a material, wherein the material has a sum of an electron affinity and a bandgap energy of at least 6 eV. In some embodiments, the material can include a p-type semiconductor material.

An embodiment of such a device can have an enhancement-mode HEMT with a higher threshold voltage as compared to each of a HEMT with (1) a p-type GaN gate electrode without a gate dielectric layer and (2) a gate dielectric layer and a metal gate electrode. In a non-limiting embodiment, a relatively higher threshold voltage can be obtained where the gate electrode includes a polycrystalline p-type semiconductor material having a work function of approximately 7 eV. In another embodiment, a p-type Si material may be used and has a work function of approximately 5.1 eV. The relatively higher work function (as compared to chemical vapor deposited TiN) provides for an increase in the threshold voltage. The threshold voltage may increase by approximately 1 V for each 1 eV increase in the work function. In a particular embodiment, the increase can be at least 0.2 V, at least 0.5 V, at least 1.1 V, or higher. Thus, after reading this specification, skilled artisans will appreciate that the threshold voltage can be changed through the selection of materials for the gate electrode.

In an embodiment, a portion of the barrier layer can be left intact under the gate structure. Such a configuration can improve carrier mobility and reduce on-state resistance (Rdson). The process can allow forming a relatively thicker barrier layer and removing a portion of the barrier layer or can be incorporated with a process in which a relatively thinner barrier layer is formed, and access regions are grown from exposed portions of the barrier layer outside the gate region. Thus, the benefits as described herein can be achieved using different process flows.

FIG. 1 includes a cross-sectional view of a portion of a workpiece 100 where a HEMT is being formed. The workpiece 100 can include a substrate 102, a buffer layer 104, a channel layer 106, a barrier layer 108, and a passivation layer 110. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, include $Al_aGa_{(1-a)}N$, where $0 \le a \le 1$. The composition of the buffer layer 104 may depend on the composition of the channel layer 106 and the designed operating voltage of the HEMT. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the buffer layer 104 near the substrate 102 can be 10 atomic % to 100 atomic % Al with the remainder Ga, and the cation content in the buffer layer 104 near the channel layer 106 can be 0 atomic % to 50 atomic % Al with the remainder Ga. In another embodiment, the buffer layer 104 can include a plurality of films. The buffer layer 104 can have a thickness in a range from approximately 1 micron to 5 microns.

The channel layer 106 can include $Al_zGa_{(1-z)}N$, where $0 \le z \le 0.1$ and have a thickness in a range from approximately 10 nm to 4000 nm. In a particular embodiment, the channel layer 106 is a GaN layer (z=0). The channel layer 106 may be unintentionally doped or doped with an electron donor (n-type) dopant or an electron acceptor (p-type) dopant. A high density two dimensional electron gas (2DEG) can be formed near portions of the interface of the channel layer 106 and the barrier layer 108 and is responsible for high mobility and lower resistivity of the transistor structure when in the on-state. In an enhancement-mode HEMT, a 2DEG may not be present under the gate structure when the HEMT is in an off-state. Any reduction of the 2DEG electrons will increase the on-state resistance of the transistor. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and, such carbon can result in unintentional doping. The carbon content may be controlled by controlling the deposition conditions, such as the deposition temperature and flow rates. In an embodiment, the channel layer 106 has a carrier impurity concentration that is greater than 0 and less than $1 \times 10^{14}$ atoms/cm$^3$, less than $1 \times 10^{15}$ atoms/cm$^3$, or less than $1 \times 10^{16}$ atoms/cm$^3$, and in another embodiment, at most $1 \times 10^{16}$ atoms/cm$^3$. In a further embodiment, the carrier impurity concentration is in a range from $1 \times 10^{13}$ atoms/cm$^3$ to $1 \times 10^{16}$.

In an embodiment, the channel layer 106 has a thickness that is at least 50 nm. When the thickness is less than 50 nm, a 2DEG may be more difficult to generate, maintain, or both. In another embodiment, the channel layer 106 has a thickness that is at most 5000 nm. In a particular embodiment, the thickness in a range from 50 nm to 300 nm can provide a sufficiently thick channel layer 106 to allow for the proper generation and maintaining of the 2DEG and still obtain a reasonable Rdson. Although not illustrated, a spacer layer may be used between the channel and barrier layers 106 and 108 if desired.

The barrier layer 108 can include a III-V semiconductor material, such as a III-N semiconductor material. In a particular embodiment, the barrier layer can include $Al_x In_y Ga_{(1-x-y)}N$, wherein $0 < x \le 1$ and $0 \le y \le 0.3$. The barrier layer 108 can include a single film or a plurality of films. When the barrier layer 108 includes a plurality of films, the aluminum content can remain substantially the same or increase as distance from the channel layer 106 increases. As the aluminum content in the barrier layer 108 increases, the thickness of the barrier layer 108 may be relatively thinner. In an embodiment, the barrier layer 108 has a thickness of at least 10 nm, and in another embodiment, the barrier layer 108 has a thickness of at most 150 nm. In a particular embodiment, the barrier layer 108 has a thickness in a range from 20 nm to 90 nm.

The buffer layer 104, the channel layer 106, and barrier layer 108 are formed using an epitaxial growth technique, and thus, the barrier layer 108, the channel layer 106, and at least a portion of the buffer layer 104 can be monocrystalline. In a particular embodiment, metal-containing films can be formed using metalorganic chemical vapor deposition.

The passivation layer 110 can include one or more films. In an embodiment, the passivation layer 110 can include a single silicon nitride film. In another embodiment, the passivation layer 110 may include a lower silicon nitride film closer to the barrier layer 108, an aluminum nitride film, and an upper silicon nitride film farther from the barrier layer 108, wherein the aluminum nitride film is disposed between the two silicon nitride films. The passivation layer 110 can be deposited by metalorganic chemical vapor deposition (MOCVD) to maintain the crystal quality of the underlying layers. The passivation layer 110 has a thickness in a range from 2 nm to 150 nm.

The passivation layer 110 is patterned to remove portions of the barrier layer 108 and the passivation layer 110 within a gate region where a gate structure will be subsequently formed. The silicon nitride film(s) can be used removed using a dry etch using a fluorine chemistry, such as $SF_6$, $CHF_3$, $NF_3$, or the like. Aluminum-containing films or layers are not significantly etched using a fluorine chemistry, as $AlF_3$ forms and stops further etching of the aluminum-containing films or layers. Thus, the barrier layer 108 is not significantly etched after silicon nitride film in contact with the barrier layer 108 is removed. When the passivation layer 110 includes the aluminum nitride film, the aluminum nitride film can be removed using a chlorine chemistry, such as $BCl_3$, HCl, $Cl_2$, or the like, or wet etched using a base, such as tetramethyl ammonium hydroxide (($CH_3$)$_4$)NOH or TMAH), KOH, NaOH, or the like. Dry etching of the single film or combination of films of the passivation layer 110 can be performed using timed etches, endpoint detection, or a combination of endpoint detection with a timed overetch.

When etching the barrier layer 108, care may be exercised to help maintain the crystal quality of the barrier layer 108 and the channel layer 106. For example, when the barrier layer 108 is plasma etched, exposed portions of the barrier layer 108, the channel layer 106, or both may be damaged by the plasma, thus, reducing the crystal quality at a location where a gate structure is subsequently formed. In a non-limiting embodiment, atomic layer etching may be used to remove the portion of the barrier layer 108. For atomic layer etching, a monolayer of an oxide is formed from the barrier layer 108, and the oxide is removed using a wet etchant. Approximately 1.0 nm to 1.9 nm of thickness of the barrier layer 108 is removed for each oxidation-wet etch cycle. The oxidation and wet etching is repeated until a desired thickness of the barrier layer 108 is removed. In an embodiment, some of the barrier layer 108 remains along a bottom of the opening and has a thickness that is greater than 0 nm and at most 5 nm. The remaining portion of the barrier layer 108 helps to improve carrier mobility under the gate structure and keep Rdson lower than if a subsequently-formed gate dielectric layer contacts the channel layer 106. In another embodiment, the barrier layer 108 can be etched until the channel layer 106 is exposed.

Figure 2:
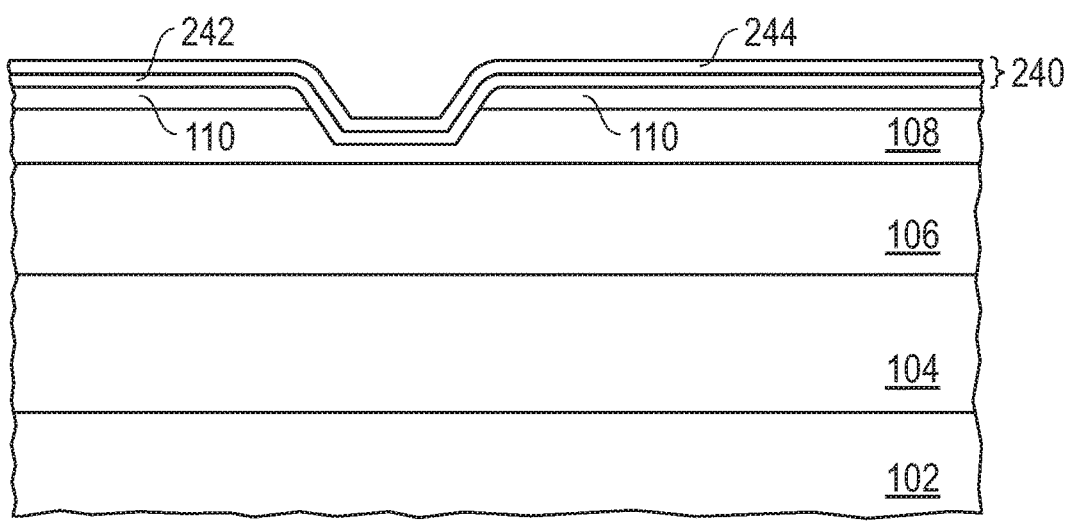
FIG. 2 includes an illustration of a cross-sectional view of the workpiece of FIG. 1 after patterning a portion of the buffer layer and forming a gate dielectric layer.

A gate dielectric layer 240 is formed over the channel and barrier layers 106 and 108, as illustrated in FIG. 2. The gate dielectric layer can include a lower dielectric film 242 and may include one or more other films. In the embodiment illustrated, the gate dielectric layer 240 further includes an upper dielectric film 244. The lower dielectric film 242 can be formed in contact with the underlying semiconductor layer, such as the barrier layer 108 or the channel layer 106, using a technique to achieve a desired interface between the underlying semiconductor layer and the lower dielectric film 242. The lower dielectric film 242 can have a variety of compositions that may be depend on the composition of the underlying semiconductor layer. In an embodiment, the lower dielectric film 242 may include a nitride, an oxide, or an oxynitride. An exemplary material can include $Si_3N_4$, $Al_2O_3$, $ZrO_2$, $HfO_2$, $SiO_2$, $TiO_2$, $Ta_2O_5$, $Nb_2O_5$, another suitable metal oxide, or a corresponding oxynitride.

The deposition technique may depend on the particular material being formed for the lower dielectric film 242. For $Si_3N_4$, the lower dielectric film 242 can be formed using a silicon halide and a nitrogen-containing source gas. In an embodiment, the silicon halide can include $SiH_3Cl$, $SiH_2Cl_2$, $SiHCl_3$, or the like, and the nitrogen-containing gas can include $NH_3$, $N_2$, $N_2O$, $N_2H_4$, or the like. In a particular embodiment, $SiH_2Cl_2$ and $NH_3$ can be used as source gases, and the deposition can be performed at a temperature of at least 1000° C. to form $Si_3N_4$. In a particular embodiment, the deposition may be performed at a temperature of at most 1150° C. An interface between the lower dielectric film 242 and the underlying semiconductor layer has a density of interface traps of at most $1 \times 10^{13}$ $eV^{-1}$ $cm^{-2}$.

The lower dielectric film 242 can include a metal oxide or a metal oxynitride. Metal oxides and metal oxynitrides may be formed using MOCVD, atomic layer deposition (ALD), or inorganic CVD (to distinguish from MOCVD). The metal precursor can be a metal hydride, a metal halide, a metal alkane, a metal alkoxide, or a metal amine or amide. The metal halide may or may not be in the form of a hydrate. An aluminum source gas can include trimethyl aluminum (Al($CH_3$)$_3$), aluminum chloride hexahydrate ($AlCl_3.6H_2O$), aluminum bromide ($AlBr_3$) or the like. An oxygen source gas can include $O_2$, $O_3$, $H_2O$, $N_2O$, or the like.

A hafnium source gas can include hafnium butoxide (Hf($OC_4H_9$)$_4$) and hafnium 2-methoxymethyl-2-propoxide (Hf($OC_4H_9OCH_3$)$_4$), hafnium dimethylamide (Hf(N($CH_3$)$_2$)$_4$), hafnium diethylamide (Hf(N($C_2H_5$)$_2$)$_4$), hafnium tetrachloride ($HfCl_4$), or the like. Zirconium and titanium have similar compounds as hafnium, where Zr or Ti is substituted for Hf. Niobium, tantalum, and vanadium may be in the form of a dimethylamide (e.g., Nb(N($CH_3$)$_2$)$_5$), a diethylamide (e.g., Nb(N($CH_2CH_3$)$_2$)$_5$), an ethoxide (e.g., Nb($OC_2H_5$)$_5$), or the like. The deposition may be performed as a decomposition of the metal source gas or may include an oxygen source gas or a nitrogen source gas, as previously described.

If possible, the deposition may be performed at a temperature of at least 1000° C. If the deposition does not allow such a high temperature, some or all of the lower dielectric film 242 can be deposited and then annealed at a temperature of at least 600° C. For example, for ALD, the deposition may be at a temperature in a range from 300° C. to 600° C. The lower dielectric film 242 can be formed in an iterative process of a deposition of a monolayer of the metal precursor followed by an anneal of at least 600° C. The process can be iterated for at least two monolayers and for as many monolayers needed to achieve a desired thickness.

The upper dielectric film 244 can include a material that has a conduction band and a valence band at higher energies as compared to a semiconductor material of the channel layer 106 and the material of the lower dielectric film 242. The material of the upper dielectric film 244 can have a larger bandgap energy as compared to the semiconductor material of the channel layer 106 and the material of the lower dielectric film 242. When the lower dielectric film 242 includes $Si_3N_4$, the upper dielectric film 244 can include $Al_2O_3$, $ZrO_2$, $HfO_2$, $SiO_2$, $TiO_2$, $Ta_2O_5$, $Nb_2O_5$, another suitable metal oxide, or a corresponding oxynitride.

The continued process description regarding the gate dielectric layer 240 is based on the embodiment as illustrated in the figures. After reading this specification, skilled artisans will appreciate that other embodiments can be used without departing from the concepts as described herein. In an embodiment, the lower dielectric film 242 can include a silicon nitride film. The thickness of the interface film can be in a range from 10 nm to 40 nm. The upper dielectric film 244 can include an aluminum oxide film. The upper dielectric film 244 can be deposited using MOCVD, although deposition using MOCVD is not required. The oxide film 244 has a thickness in a range from 5 nm to 120 nm.

Figure 3:
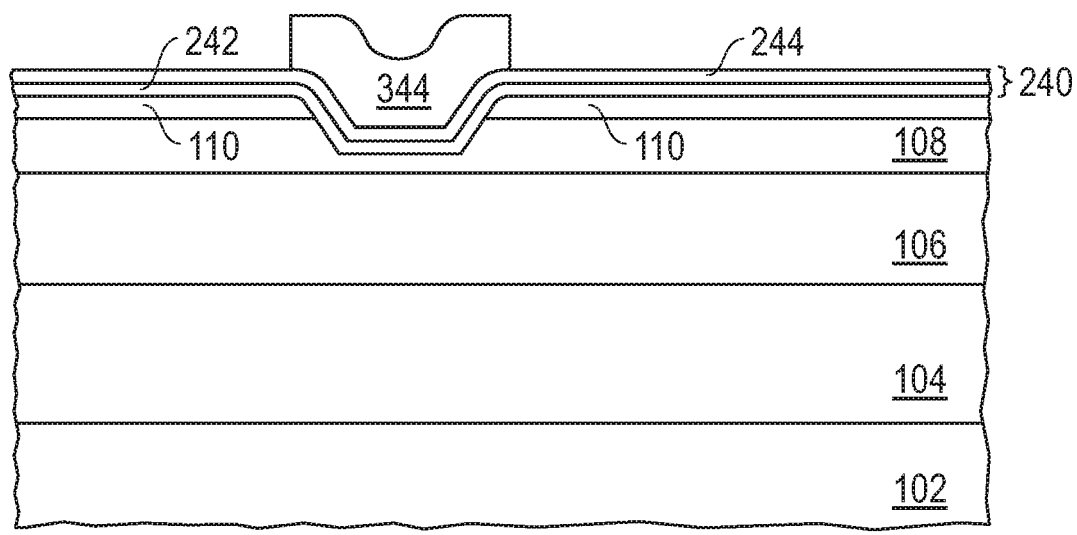
FIG. 3 includes an illustration of a cross-sectional view of the workpiece of FIG. 2 after forming a lower gate electrode film.

A lower gate electrode film 344 overlies the gate dielectric layer 240, as illustrated in FIG. 3. The lower gate electrode film 344 can include a material that has a sum of an electron affinity and a bandgap energy of at least 6 eV. An example of such material can include a polycrystalline p-type semiconductor material. In an embodiment, the polycrystalline p-type semiconductor material can include polycrystalline p-type $Al_cGa_{(1-c)}N$ wherein $0 \leq c \leq 1$. Unintentionally doped polycrystalline GaN has n-type conductivity, and thus, the lower gate electrode film 344 includes a p-type dopant, such as Mg, Zn, Cd, or the like. In another embodiment, p-type SiC or p-type Si can be used for the lower gate electrode film 344. The p-type dopant for p-type SiC can include p-type dopants used in Si. The lower gate electrode film 344 can have a dopant concentration of at least $1 \times 10^{17}$ atoms/cm$^3$. In another embodiment, the dopant concentration is at most $1 \times 10^{22}$ atoms/cm$^3$. The lower gate electrode film 344 can be formed using any of the techniques that can be used in forming the channel layer 106 or the barrier layer 108. The p-type dopant can be incorporated in-situ or introduced into the film after deposition. In a particular embodiment, the lower gate electrode film 344 can be formed using molecular beam epitaxy at a temperature in a range from 625° C. to 675° C.

When the lower gate electrode film 344 includes p-type GaN, the work function is approximately 6 eV to 7 eV and can increase the threshold voltage by more than 2 V as compared to chemical vapor deposited TiN. In another embodiment, p-type Si can be used which has a work function of approximately 5.1 eV. Thus, p-type Si can increase the threshold voltage by approximately 0.5 V. The lower gate electrode film 344 can have a thickness in a range from 10 nm to 300 nm. In another embodiment, the lower gate electrode film 344 can be thicker, if needed or desired.

The lower gate electrode film 344 can be patterned to achieve the shape of a gate electrode for the enhancement-mode HEMT being formed. A portion of the lower gate electrode film 344 lying outside the gate region can be removed using a technique that does not significantly etch the gate dielectric layer 240. When the lower gate electrode film 344 includes p-type GaN and the upper gate dielectric film 244 includes $Al_2O_3$, the lower gate electrode film 344 can be dry etched using a fluorine chemistry as previously described. In another embodiment, the lower gate electrode film 344 can be etched using molten KOH. After reading this specification, skilled artisans will be able to determine an etchant to be used during patterning based at least in part on the particular materials of the upper gate dielectric film 244 and the lower gate electrode film 344.

Figure 4:
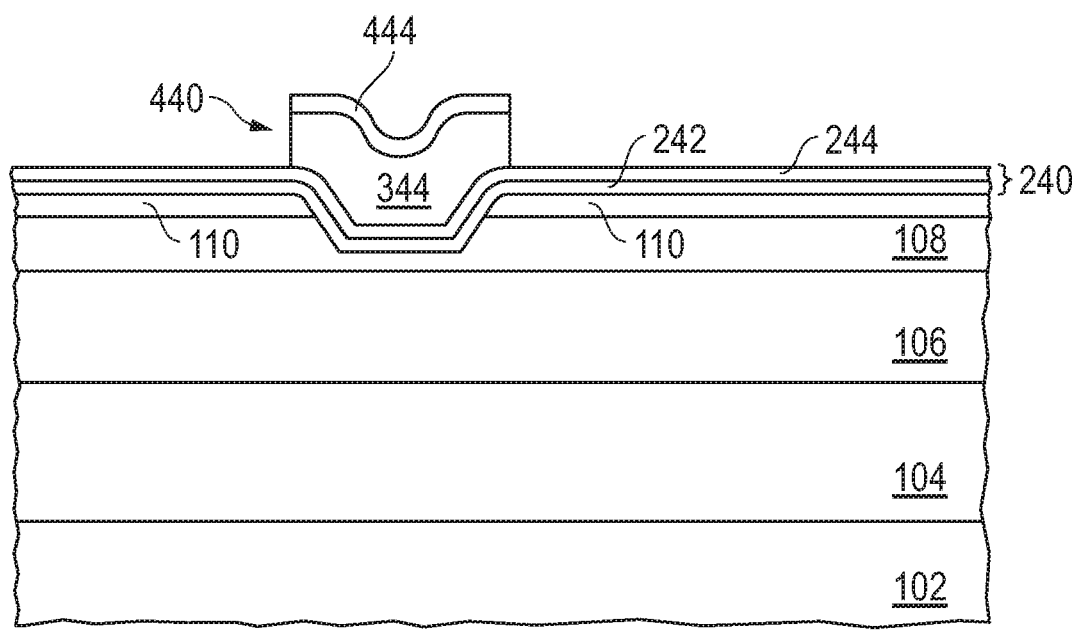
FIG. 4 includes an illustration of a cross-sectional view of the workpiece of FIG. 3 after forming an upper gate electrode film.

An upper gate electrode film 444 of a gate electrode 440 can be formed over the lower gate electrode layer 344, as illustrated in FIG. 4. The upper gate electrode film 444 includes a material that can form an ohmic contact to the lower gate electrode film 344. The material of the upper gate electrode film 444 can be a metal-containing material that has a p-type conductivity. The upper gate electrode film 444 can include NiO, Ti—Al alloy, Co, Pt, Rb, or another suitable p-type metal-containing material. Thus, an ohmic contact can form at the interface between the lower and upper gate electrode films 344 and 444. If the upper gate electrode film 444 would have an n-type conductivity, the interface between the lower and upper gate electrode films 344 and 444 would form a Schottky contact. Unintentionally doped polycrystalline GaN formed by MOCVD, Ni annealed in nitrogen, and ZnO are examples of n-type metal-containing materials and may not be used when the lower gate electrode film 344 includes a material with p-type conductivity.

The upper gate electrode film 444 has a thickness in a range from 10 nm to 500 nm. The upper gate electrode film 444 can be formed using a variety of formation techniques, such as chemical vapor deposition, ALD, molecular beam epitaxy, or the like. When the upper gate electrode film 444 includes NiO, the upper gate electrode film 444 can be formed by depositing a Ni film and oxidizing the Ni film using a rapid thermal anneal in an oxygen-containing ambient to form NiO that has a p-type conductivity. The portion of the upper gate electrode film 444 lying outside the gate region is removed. The gate electrode 440 includes the portions of the lower and upper gate electrode films 344 and 444 within the gate region.

In another embodiment, access regions may be formed to obviate the need to etch the barrier layer 108. In an embodiment, the barrier layer 108 can be formed having a thickness corresponding to the thickness of the barrier layer 108 under the gate structure. A sacrificial structure can be formed within the gate region, and the access regions can be grown over exposed portions of the relatively thin barrier layer 108. After removing the sacrificial structure, the gate dielectric layer 240 and gate electrode 440 can be formed within the gate region. Thus, different process flows may be used without deviating from the concepts as described herein.

Figure 5:
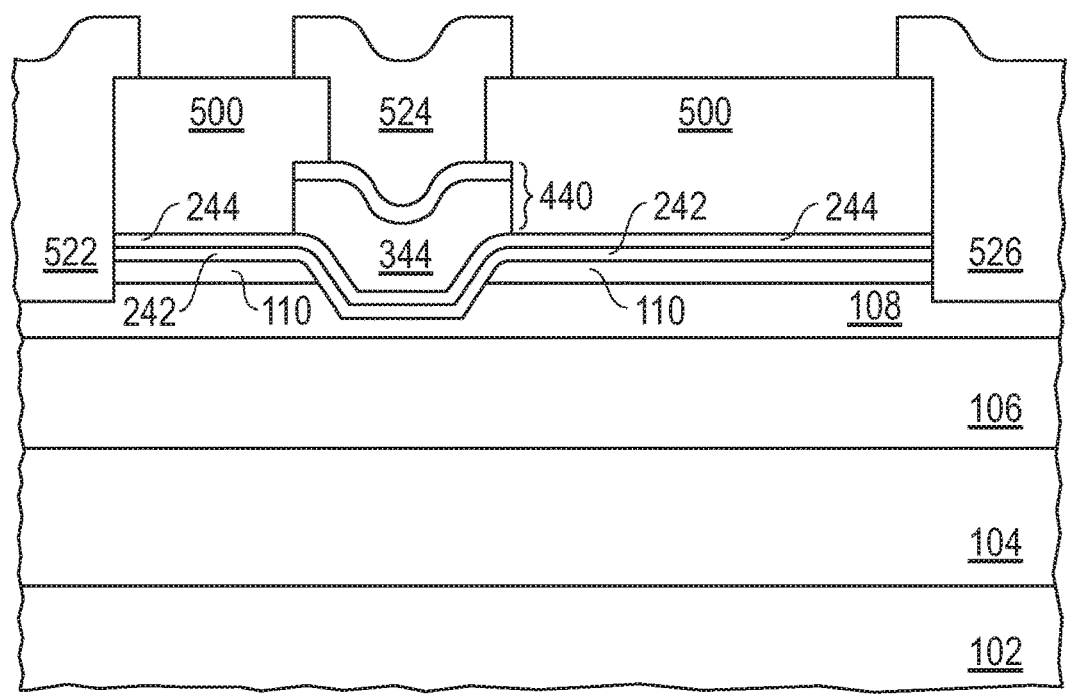
FIG. 5 includes an illustration of a cross-sectional view of the workpiece of FIG. 4 after forming source and drain electrodes, and a gate interconnect.

FIG. 5 illustrates the workpiece 100 after forming an insulating layer 500, source and drain electrodes 522 and 526 and a gate interconnect 524. The insulating layer 500 can be formed over the barrier layer 108 and the gate electrode 440 and the upper dielectric film 244. The insulating layer 500 can include an oxide, a nitride, or an oxynitride. The insulating layer 500 can have a thickness in a range from 50 nm to 500 nm. The insulating layer 500 can be patterned to define contact openings for the source and drain electrodes 522 and 526 and the gate interconnect 524.

The contact opening for the gate interconnect 524 can extend through the insulating layer 500 and land on the gate electrode 440. The contact openings for the source and drain electrode 522 and 526 can extend through the insulating layer 500, the gate dielectric layer 240, and the passivation layer 110. In an embodiment, the contact openings for the source and drain electrodes 522 and 526 land on the barrier layer 108. In another embodiment, the contact openings for the source and drain electrodes 522 and 526 can extend through part of, but not all, of the thickness of the barrier layer 108 or extend through all of the thickness of the barrier layer 108 and contact the channel layer 106. In a particular embodiment, the contact openings for the source and drain electrodes 522 and 526 are formed such that a portion of the barrier layer 108 is disposed between the channel layer 106 and the source and drain electrodes 522 and 526. The thickness of the barrier layer 108 under the source and drain electrodes 522 and 526 can be different from the thickness of the barrier layer 108 under the bottom of the gate structure. In a particular embodiment, the thickness of the barrier layer 108 under the gate structure is less than the thickness of the barrier layer 108 under the source and drain electrodes 522 and 526.

A conductive layer is formed over the gate dielectric layer 240 and within the contact openings. The conductive layer can include a single film or a plurality of films. For the gate interconnect 524, the work function of a principal material within the conductive layer can have a work function that is different from the lower gate electrode film 344, the upper gate electrode film 444, or both. In a particular embodiment, the work function of a principal material within the conductive layer can have a work function that is less than the lower gate electrode film 344.

The conductive layer can include one or more films. In an embodiment, the conductive layer can be in contact with the upper gate electrode film 444. In another embodiment (not illustrated), the upper gate electrode film 444 may not be used when the portion of the conductive layer contacting the gate electrode 440 has a p-type conductivity.

In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices.

The conductive layer is patterned to form the source electrode 522, the gate interconnect 524, and the drain electrode 526. In another embodiment, the gate interconnect 524 may be formed at a different interconnect level as compared to the source and drain electrodes 522 and 526.

One or more additional interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device has been formed.

Figure 6:
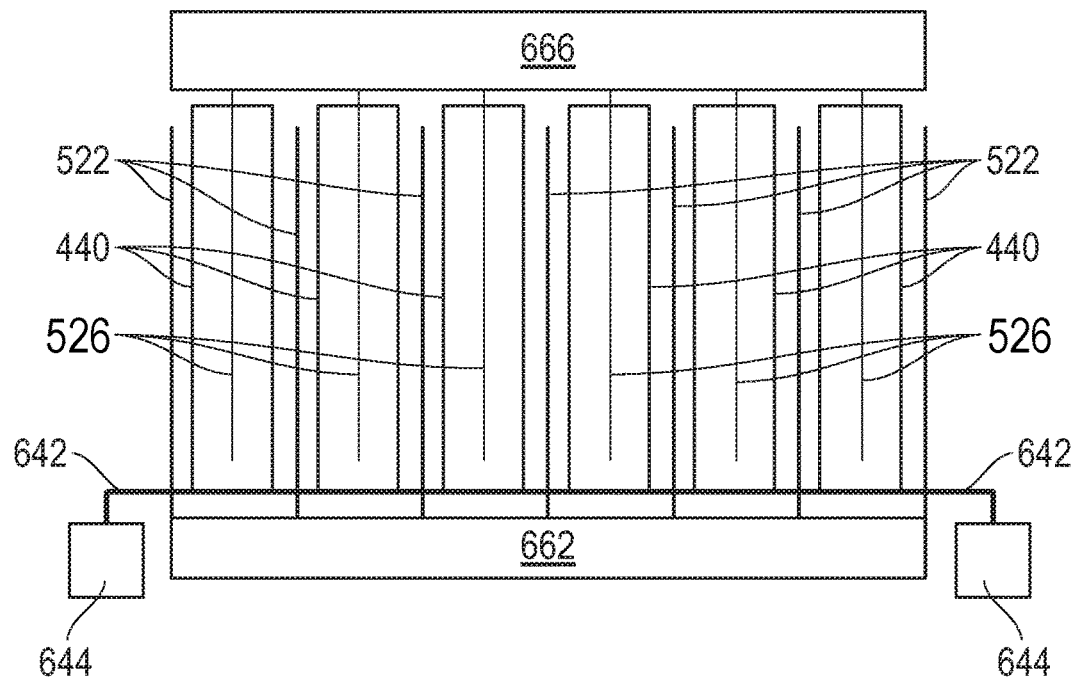
FIG. 6 includes an illustration of a top view of a layout for a multiple finger transistor design in accordance with an embodiment.
Figure 7:
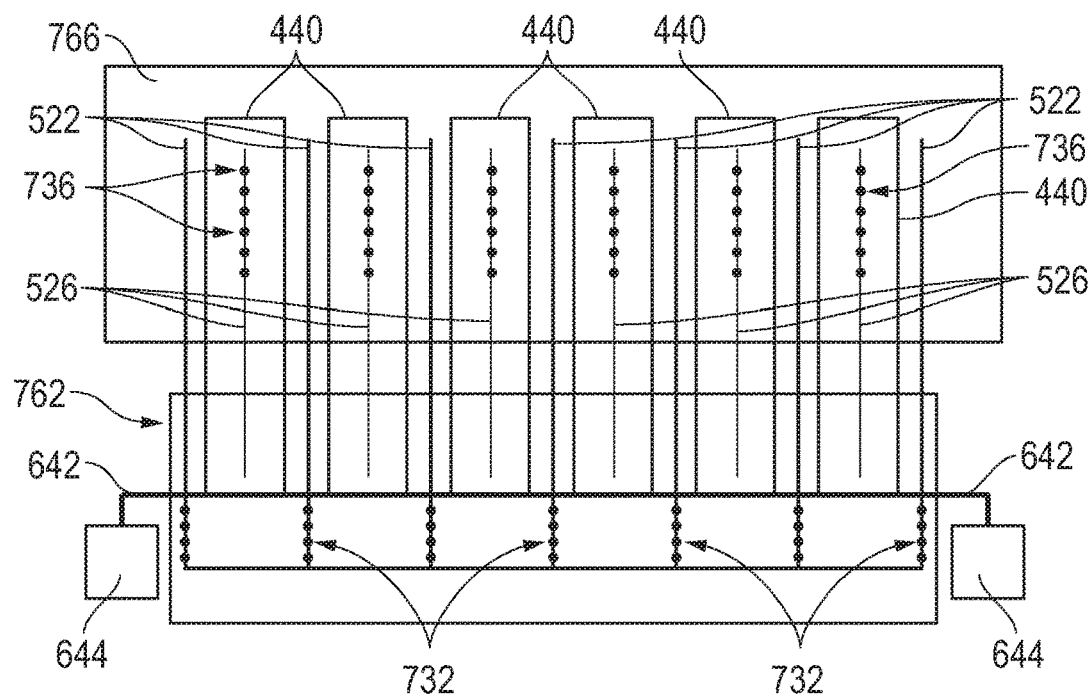
FIG. 7 includes an illustration of a top view of a layout for a multiple finger transistor design in accordance with another embodiment.

FIGS. 6 and 7 include illustrations of top views of exemplary layouts of the electronic device. The layouts illustrate multiple finger designs for the source, gate, and drain electrodes 522, 440, and 526. For simplicity, portions of the gate interconnect 524 that overlie the gate electrodes 440 are not illustrated to better illustrate the positional relationships between the gate, electrodes 440, a gate runner 642, and gate bond pads 644 within the multiple finger designs. In practice, the gate interconnect 524 can overlie the gate electrode 440 and portions that include the gate runner 642 and gate bond pads 644. The gate electrodes 440 do not underlie gate bond pads 644 and portions of the gate runner 642. In FIGS. 6 and 7, source, gate, and drain electrodes 522, 440, and 526 are illustrated in the center of the figures.

Referring to FIG. 6, a drain bond pad 666 is electrically connected to the drain electrodes 526, gate bond pads 644 are electrically connected to the gate electrodes 440 via the gate runner 642, and a source bond pad 662 is electrically connected to the source electrodes 522. The bond pads can be formed using the any of the materials and techniques described with respect to the conductive layers used for the source and drain electrodes 522 and 526. In another embodiment, the bond pads 662 and 666 can be replaced by conductive plates. Referring to FIG. 7, a drain plate 766 is electrically connected to the drain electrodes 526 via contacts 736, and a source plate 762 is electrically connected to the source electrodes 522 via contacts 732. The drain and source plates 762 and 766 can be plated onto the workpiece or may be attached as a conductive foil. A conductive material for the drain and source plates 762 and 766 can include Cu, Ni, Au, or the like. Intermediate metallization, such as Ti, TiN, TiW, W, or the like may be formed before plating, if needed or desired.

Figure 8:
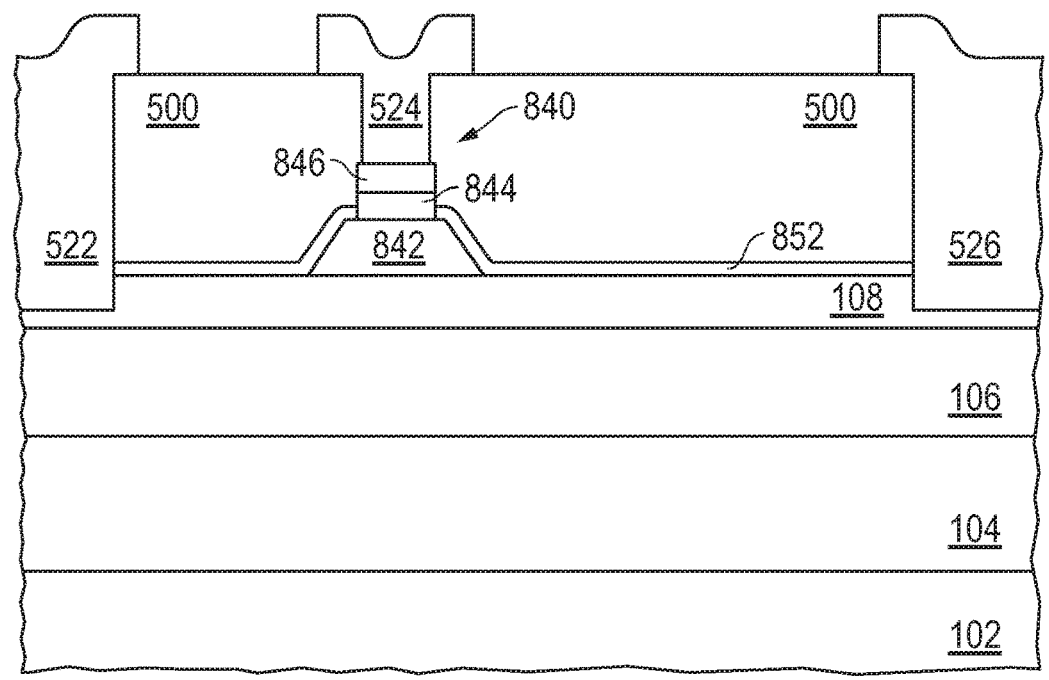
FIG. 8 includes an illustration of a cross-sectional view of a portion of a workpiece including an enhancement-mode high electron mobility transistor in accordance with another embodiment.

In another embodiment, the gate electrode of the enhancement-mode HEMT can have one or more additional gate electrode films, and the gate dielectric layer may not be needed. In FIG. 8, the gate electrode 840 includes a lowermost gate electrode film 842, an intermediate gate electrode film 844, and an uppermost gate electrode film 846. Within a gate electrode, such as the gate electrode 840 and the gate electrode 440 (FIG. 4), the gate electrode film closest to the channel layer 106, such as the lowermost gate electrode film 842 or the lower gate electrode film 344 (FIG. 4) has a work function that is the same or higher than any other gate electrode film in the gate electrode that overlies such lowermost gate electrode film 842 or the lower gate electrode film 344, and the gate electrode film farthest from the channel layer 106, such as the uppermost gate electrode film 846 or the upper gate electrode film 444 (FIG. 4) has a work function that is the same or lower than any other gate electrode film in the gate electrode that underlies such uppermost gate electrode film 846 or the upper gate electrode film 444.

In FIG. 8, the lowermost film 842 of the gate electrode 840 can be any of the compositions as described with respect to the lower film 344 or may include a monocrystalline p-type semiconductor material. In an embodiment, the monocrystalline p-type semiconductor material can include monocrystalline p-type monocrystalline $Al_dGa_{(i-d)}N$ wherein $0 \leq d \leq 1$. Unlike unintentionally doped polycrystalline GaN, monocrystalline GaN formed by MOCVD has p-type conductivity. For the monocrystalline GaN, when the p-type dopant is C, the dopant concentration may be controlled by the deposition conditions. Alternatively or in addition to the doping during deposition, the lowermost gate electrode film 842 can include a different p-type dopant, such as Mg, Zn, Cd, or the like. The lowermost gate electrode film 842 can have a dopant concentration of at least $1 \times 10^{17}$ atoms/cm$^3$. In another embodiment, the dopant concentration is at most $1 \times 10^{22}$ atoms/cm$^3$. When the lowermost gate electrode film 842 includes monocrystalline p-type GaN, the work function is approximately 6 eV to 7 eV. In a particular embodiment, the lowermost gate electrode film 842 can be epitaxially grown from the barrier layer 108. The lowermost gate electrode film 842 can have a thickness in a range from 10 nm to 300 nm. In another embodiment, the lowermost gate electrode film 842 can be thicker, if needed or desired.

A dielectric layer 852 is formed over the barrier layer 108 and lowermost gate electrode film 842. The dielectric layer 852 can include any of the materials, be formed using any of the techniques, and have any thickness as described with respect to the upper gate dielectric film 244. In a particular embodiment, the dielectric layer 852 can include $Al_2O_3$ formed by ALD. The dielectric layer 852 is patterned to expose the lowermost gate electrode film 842. The intermediate and uppermost gate electrode films 844 and 846 can be formed and patterned as illustrated in FIG. 8. The intermediate gate electrode film 844 can include any of the materials, be formed using any of the techniques, and have any thickness as described with respect to the lower gate electrode film 344. The intermediate gate electrode film 844 has a different composition or characteristic as compared to the lowermost gate electrode film 842. In a non-limiting example, the lowermost gate electrode film 842 can include monocrystalline p-type GaN, and the intermediate gate electrode film 844 can include polycrystalline p-type GaN. The uppermost gate electrode film 846 can include any of the materials, be formed using any of the techniques, and have any thickness as described with respect to the upper gate electrode film 444. Processing continues as previously described to complete formation of the enhancement-mode HEMT.

Figure 9:
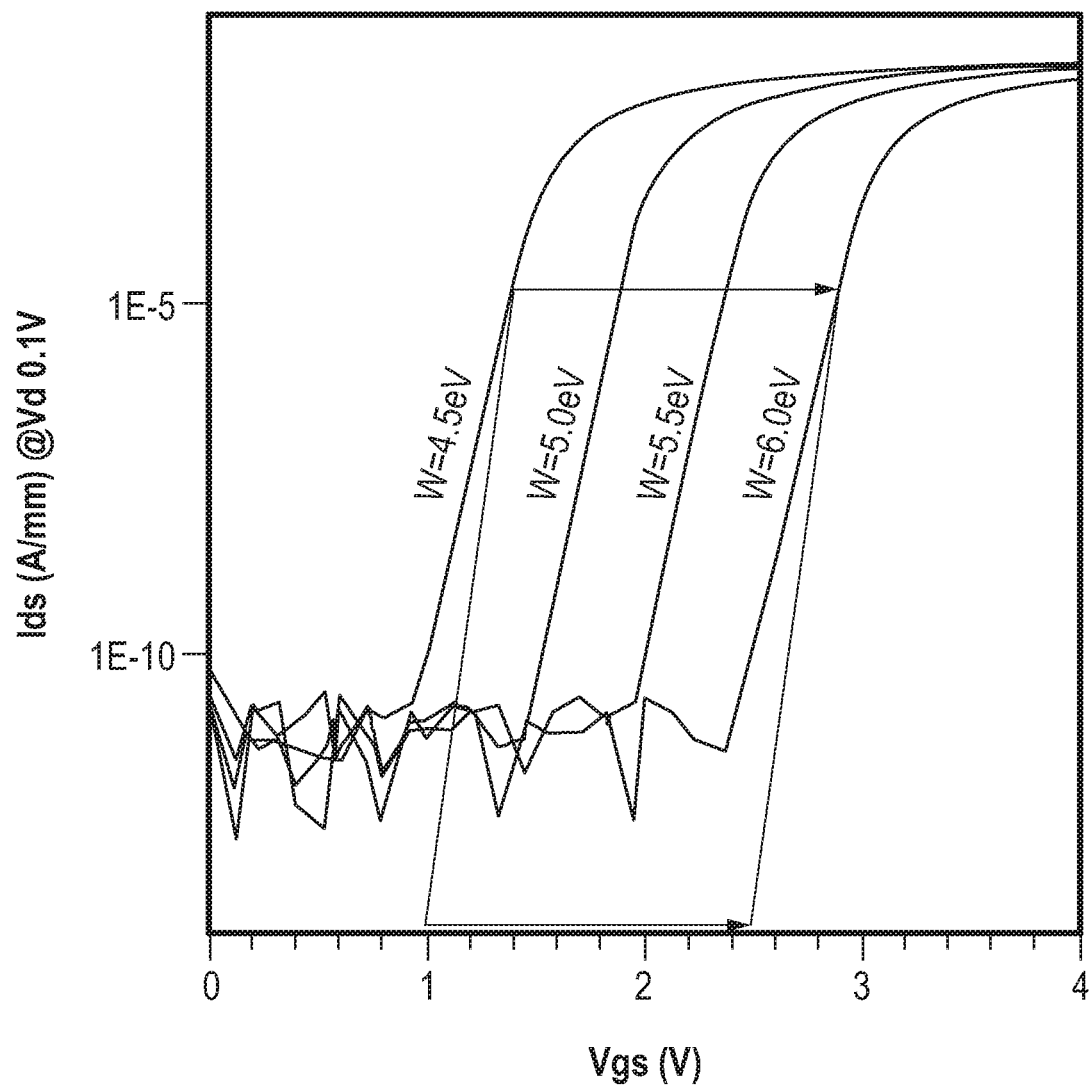
FIG. 9 includes plots of drain current as a function of gate voltage for lower gate electrode films having different work functions.

Embodiments as described herein can help to increase the threshold voltage of an enhancement-mode HEMT. The composition of the lower gate electrode film 344 can allow for a significantly higher work function than if a gate interconnect that principally includes aluminum contacts the gate dielectric layer 240. FIG. 9 includes plots of drain current (Ids) versus gate voltage (Vgs) for lower gate electrode films having different work functions (W). The plots are simulations where the gate dielectric composition and thickness are held constant and the drain voltage (Vds) is 0.1 V. As seen in FIG. 9, the threshold voltage increases by approximately 1 V for each 1 eV increase in the work function. The work function of aluminum is approximately 4.1 eV, and the work function of polycrystalline p-type GaN is in a range from 6 eV to 7 eV. Thus, when an TiN/Al gate electrode (e.g., chemical vapor deposited TiN would be in contact with the gate dielectric layer 240) is replaced by a p-type GaN gate electrode, the increase in the threshold voltage may be over 2 eV. After reading the specification, skilled artisans will be able to select a material for the lower gate electrode film 344 that increases the threshold voltage of the enhancement-mode HEMT by at least 0.2 V, at least 0.5 V, at least 1.1 V, or another voltage for a particular application. The HEMT can have better pinch-off characteristics, particularly when the threshold voltage is at least 2 V. The improved pinch-off characteristics can be particular useful in multiple finger transistor designs, such as illustrated in FIGS. 6 and 7. Similar effects are expected for the enhancement-mode HEMT as illustrated and described with respect to FIG. 8.

Materials that can be used for the upper gate electrode film 344, uppermost gate electrode film 846, and the gate interconnect 524 include metals that are commonly used in processing Si-based metal-oxide-semiconductor field-effect transistors (MOSFETs). Thus, at least part of the processing may be performed in a fabrication area that is used in forming MOSFETs.

Furthermore, a relatively high quality interface is formed between the gate dielectric layer 240 and the underlying semiconductor layer, such as the barrier layer 108 or the channel layer 106. The process does not require dry etching the barrier layer 108, and thus, a surface of the barrier layer 108 or the channel layer 106 can have less plasma damage since the barrier layer 108 is not plasma etched. The gate dielectric layer 240 can be formed using processing conditions that help to maintain the crystal qualify of the barrier layer 108 and channel layer 106. The gate dielectric layer 240 can be formed using processing conditions that help to produce an enhancement-mode HEMT having a reduced density of interface states and carrier traps at the interface between the gate dielectric layer 240 and the underlying semiconductor layer, such as the barrier layer 108 or the channel layer 106.

In an embodiment, a portion of the barrier layer 108 keeps the gate structure spaced apart from the channel layer 106. Such a configuration can improve carrier mobility and reduce Rdson. The increased work function of the lower gate electrode film 344 allows the threshold voltage of the HEMT to be sufficiently high enough to properly pinch off the transistor under the gate structure when the HEMT is in the off-state.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a channel layer including $Al_zGa_{(1-z)}N$, where $0 \le z \le 0.1$; a gate dielectric layer; and a gate electrode of a high electron mobility transistor, wherein the gate dielectric layer is disposed between the channel layer and the gate electrode, and the gate electrode includes a first gate electrode film that contacts the gate dielectric layer, wherein the first gate electrode film includes a material, wherein the material has a sum of an electron affinity and a bandgap energy of at least 6 eV.

Embodiment 2

The electronic device of Embodiment 1, wherein the gate dielectric layer includes a first dielectric film and a second dielectric film overlying the first dielectric film, wherein an interface between the first dielectric film and an underlying semiconductor layer has a density of interface traps that is at most $1 \times 10^{13}$ $eV^{-1}$ $cm^{-2}$.

Embodiment 3

The electronic device of Embodiment 2, wherein the underlying semiconductor layer is the channel layer or a barrier layer disposed between the channel layer and the first dielectric film.

Embodiment 4

The electronic device of Embodiment 1, wherein the gate dielectric layer includes a first dielectric film including a first dielectric material; and a second dielectric film overlying the first dielectric film and including a second dielectric material, wherein the second dielectric material has a conduction band and a valence band at higher energies as compared to a semiconductor material of the channel layer and the first dielectric material, and the second dielectric material has a larger bandgap energy as compared to the semiconductor material of the channel layer and the first dielectric material.

Embodiment 5

The electronic device of Embodiment 4, wherein the second dielectric material is an oxide.

Embodiment 6

The electronic device of Embodiment 1, wherein the material of the first gate electrode film includes the polycrystalline p-type semiconductor material having a dopant concentration of at least $1 \times 10^{17}$ atoms/cm$^3$.

Embodiment 7

The electronic device of Embodiment 6, wherein the gate electrode further includes a second gate electrode film overlying the first gate electrode film, wherein an ohmic contact is formed at an interface between the first and second gate electrode films.

Embodiment 8

The electronic device of Embodiment 7, wherein the second gate electrode film is a p-type metal-containing film.

Embodiment 9

The electronic device of Embodiment 7, wherein the p-type metal-containing film includes a metal having a work function greater than a work function of aluminum.

Embodiment 10

The electronic device of Embodiment 7, wherein the second gate electrode film includes a metal having a work function in a range from 4.6 eV to 6.0 eV.

Embodiment 11

The electronic device of Embodiment 7, wherein the metal-containing film includes a Ti—Al alloy, Co, Pt, or Rb.

Embodiment 12

The electronic device of Embodiment 7, further includes a gate interconnect in contact with the gate electrode, wherein the second gate electrode film is disposed between the first gate electrode film and the gate interconnect.

Embodiment 13

The electronic device of Embodiment 12, wherein a principal metal of the gate interconnect has a work function that is less than a work function of the first gate electrode film.

Embodiment 14

The electronic device of Embodiment 12, wherein the transistor has a threshold voltage that is at least 0.2 V greater than a different transistor having an identical construction except that the first and second gate electrode films are not present.

Embodiment 15

The electronic device of Embodiment 1, further includes a barrier layer overlying the channel layer and including $Al_xIn_yGa_{(1-x-y)}N$ wherein $0<x\leq1$, and $0\leq y\leq0.3$; a source electrode of the transistor; and a drain electrode of the transistor, wherein the source and drain electrodes extend at least partly through the barrier layer.

Embodiment 16

The electronic device of Embodiment 15, wherein the barrier layer has a first thickness between the gate electrode and the channel layer, wherein the first thickness is greater than 0 nm and at most 5 nm.

Embodiment 17

The electronic device of Embodiment 16, wherein the barrier layer has a second thickness between the channel layer and the source or drain electrode, wherein the first thickness is less than the second thickness.

Embodiment 18

An electronic device can include a channel layer including $Al_zGa_{(1-z)}N$, where $0\leq z\leq0.1$; and a gate electrode of a high electron mobility transistor, wherein:
the gate dielectric layer overlies the channel layer,
the gate electrode includes a first gate electrode film and a second gate electrode film,
within the gate electrode, the first gate electrode film is closer to the channel layer as compared to any other gate electrode film in the gate electrode, and the second gate electrode film is farther from the channel layer as compared to any other gate electrode film in the gate electrode, and
the first gate electrode film includes a first material, wherein the first material has a sum of an electron affinity and a bandgap energy of at least 6 eV.

Embodiment 19

The electronic device of Embodiment 18, wherein the gate electrode further includes a third gate electrode film disposed between the first and second gate electrode films, the third gate electrode film has a work function that is the same or less than a work function of the first gate electrode film and the same or greater than a work function of the second gate electrode film.

Embodiment 20

The electronic device of Embodiment 19, further includes a barrier layer overlying the channel layer, wherein the first gate electrode film contacts a barrier layer and includes monocrystalline p-type GaN, the third gate electrode film includes polycrystalline p-type GaN, and the second gate electrode film includes a metal-containing film wherein an ohmic contact is formed at an interface between the second and third gate electrode films.

Embodiment 21

An electronic device including a high electron mobility transistor can include:
a channel layer including GaN;
a barrier layer over the channel layer and including $Al_xIn_yGa_{(1-x-y)}N$ wherein $0<x\leq1$, and $0\leq y\leq0.3$;
a gate dielectric layer extending partly, and not completely, through the barrier layer, wherein:
the gate dielectric layer includes a first dielectric film and a second dielectric film overlying the first dielectric film,
the first dielectric film includes a first dielectric material,
the second dielectric film includes a second dielectric material different from the first dielectric material,
the second dielectric material has a conduction band and a valence band at higher energies as compared to a semiconductor material of the channel layer and the first dielectric material, and
the second dielectric material has a larger bandgap energy as compared to the semiconductor material of the channel layer and the first dielectric material,
a gate electrode, wherein the gate dielectric layer is disposed between the channel layer and the gate electrode, and the gate electrode includes:
a polycrystalline p-type semiconductor film in contact with the gate dielectric layer; and a metal-containing film overlying and in contact with the polycrystalline p-type semiconductor film, wherein:
an ohmic contact is formed at an interface between the polycrystalline p-type semiconductor film and the metal-containing film, and
the metal-containing film includes a metal having a work function greater than a work function of aluminum;
a gate interconnect contacting the gate electrode;
a source electrode; and
a drain electrode.

Embodiment 22

The electronic device of Embodiment 21, wherein the high electron mobility transistor is an enhancement-mode transistor, an interface between the first dielectric film and the barrier layer has a density of interface traps of at most $1 \times 10^{13}$ eV$^{-1}$ cm$^{-2}$, and the gate interconnect has a work function that is less than a work function of the metal-containing film.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a channel layer including Al$_z$Ga$_{(1-z)}$N, where $0 \leq z \leq 0.1$;
a gate dielectric layer; and
a gate electrode of a high electron mobility transistor, wherein the gate dielectric layer is disposed between the channel layer and the gate electrode, and the gate electrode includes:
a first gate electrode film that contacts the gate dielectric layer, wherein the first gate electrode film includes a polycrystalline p-type Al$_c$Ga$_{(1-c)}$N wherein $0 \leq c \leq 1$ having a sum of an electron affinity and a bandgap energy of at least 6 eV and a dopant concentration of at least $1 \times 10^{17}$ atoms/cm$^3$; and
a second gate electrode film overlying the first gate electrode film, wherein an ohmic contact is formed at an interface between the first and second gate electrode films; and
a gate interconnect in contact with the gate electrode, wherein:
the second gate electrode film is disposed between the first gate electrode film and the gate interconnect, and
a principal metal of the gate interconnect has a work function that is less than a work function of the first gate electrode film.

2. The electronic device of claim 1, wherein the gate dielectric layer includes a first dielectric film and a second dielectric film overlying the first dielectric film, wherein an interface between the first dielectric film and an underlying semiconductor layer has a density of interface traps that is at most $1 \times 10^{13}$ eV$^{-1}$ cm$^{-2}$.

3. The electronic device of claim 1, wherein the gate dielectric layer comprises:
a first dielectric film including a first dielectric material; and
a second dielectric film overlying the first dielectric film and including a second dielectric material,
wherein:
the second dielectric material has a conduction band and a valence band at higher energies as compared to a semiconductor material of the channel layer and the first dielectric material, and
the second dielectric material has a larger bandgap energy as compared to the semiconductor material of the channel layer and the first dielectric material.

4. The electronic device of claim 3, wherein the second dielectric material is an oxide.

5. The electronic device of claim 1, wherein the second gate electrode film is a p-type metal-containing film.

6. The electronic device of claim 5, wherein the p-type metal-containing film includes a metal having a work function greater than a work function of aluminum.

7. The electronic device of claim 1, wherein the second gate electrode film includes a metal having a work function in a range from 4.6 eV to 6.0 eV.

8. The electronic device of claim 1, wherein the second gate electrode film includes a Ti—Al alloy, Co, Pt, or Rb.

9. The electronic device of claim 1, wherein the transistor has a threshold voltage that is at least 0.2 V greater than a different transistor having an identical construction except that the first and second gate electrode films are not present.

10. The electronic device of claim 1, further comprising:
a barrier layer overlying the channel layer and including Al$_x$In$_y$Ga$_{(1-x-y)}$N wherein $0 < x \leq 1$, and $0 \leq y \leq 0.3$;
a source electrode of the transistor; and
a drain electrode of the transistor,
wherein the source and drain electrodes extend at least partly through the barrier layer.

11. The electronic device of claim 10, wherein the barrier layer has a first thickness between the gate electrode and the channel layer, wherein the first thickness is greater than 0 nm and at most 5 nm.

12. An electronic device comprising:
a channel layer including Al$_z$Ga$_{(1-z)}$N, where $0 \leq z \leq 0.1$; and
a gate electrode of a high electron mobility transistor, wherein:

the gate electrode layer overlies the channel layer,
the gate electrode includes a first gate electrode film, a second gate electrode film including a metal-containing material, and a third gate electrode film disposed between the first gate electrode film and the second gate electrode film,
within the gate electrode, the first gate electrode film is closer to the channel layer as compared to any other gate electrode film in the gate electrode, and the second gate electrode film is farther from the channel layer as compared to any other gate electrode film in the gate electrode,
the first gate electrode film includes a first material, wherein the first material has a sum of an electron affinity and a bandgap energy of at least 6 eV, and
the third gate electrode film has a work function that is the same or less than a work function of the first gate electrode film and the same or greater than a work function of the second gate electrode film, and the work function of the third gate electrode film is different from the work function of the first gate electrode film or the work function of the second gate electrode film.

13. The electronic device of claim 12, further comprising a barrier layer overlying the channel layer, wherein:
the first gate electrode film contacts a barrier layer and includes monocrystalline p-type GaN,
the third gate electrode film includes polycrystalline p-type GaN, and
the second gate electrode film includes a metal-containing film wherein
an ohmic contact is formed at an interface between the second and third gate electrode films.

14. An electronic device including a high electron mobility transistor comprising:
a channel layer including GaN;
a barrier layer over the channel layer and including $Al_xIn_yGa_{(1-x-y)}N$ wherein $0<x\leq1$, and $0\leq y\leq0.3$;
a gate dielectric layer extending partly, and not completely, through the barrier layer, wherein:
the high electron mobility transistor is an enhancement-mode transistor,
the gate dielectric layer includes a first dielectric film and a second dielectric film overlying the first dielectric film,
the first dielectric film includes a first dielectric material,
an interface between the first dielectric film and the barrier layer has a density of interface traps of at most $1\times10^{13}$ $eV^{-1}$ $cm^{-2}$,
the second dielectric film includes a second dielectric material different from the first dielectric material,
the second dielectric material has a conduction band and a valence band at higher energies as compared to a semiconductor material of the channel layer and the first dielectric material, and
the second dielectric material has a larger bandgap energy as compared to the semiconductor material of the channel layer and the first dielectric material,
a gate electrode, wherein the gate dielectric layer is disposed between the channel layer and the gate electrode, and the gate electrode includes:
a polycrystalline p-type semiconductor film in contact with the gate dielectric layer; and
a metal-containing film overlying and in contact with the polycrystalline p-type semiconductor film, wherein:
an ohmic contact is formed at an interface between the polycrystalline p-type semiconductor film and the metal-containing film, and
the metal-containing film includes a metal having a work function greater than a work function of aluminum;
a gate interconnect contacting the gate electrode, wherein the gate interconnect has a work function that is less than a work function of the metal-containing film;
a source electrode; and
a drain electrode.

15. The electronic device of claim 14, wherein the polycrystalline p-type semiconductor film is a polycrystalline p-type $Al_cGa_{(1-c)}N$ wherein $0\leq c\leq1$.

16. The electronic device of claim 1, wherein the second gate electrode film includes NiO.

* * * * *